United States Patent
Kang et al.

(10) Patent No.: US 8,530,882 B2
(45) Date of Patent: Sep. 10, 2013

(54) LIGHT EMITTING DEVICE, LIGHT EMITTING DEVICE PACKAGE AND LIGHTING SYSTEM

(75) Inventors: Jeung Mo Kang, Seoul (KR); Sun Kyung Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 273 days.

(21) Appl. No.: 12/893,710

(22) Filed: Sep. 29, 2010

(65) Prior Publication Data
US 2011/0133233 A1 Jun. 9, 2011

(30) Foreign Application Priority Data
Dec. 8, 2009 (KR) .................. 10-2009-0121121

(51) Int. Cl.
*H01L 33/38* (2010.01)

(52) U.S. Cl.
USPC ............... 257/13; 257/79; 257/95; 257/99; 257/E33.062; 257/E33.065

(58) Field of Classification Search
USPC ........... 257/13, 79, 95, 99, E33.062, E33.065
See application file for complete search history.

(56) References Cited

U.S. PATENT DOCUMENTS

| | | | | |
|---|---|---|---|---|
| 6,420,732 B1* | 7/2002 | Kung et al. | .................... | 257/79 |
| 6,495,862 B1 | 12/2002 | Okazaki et al. | | |
| 6,720,584 B2 | 4/2004 | Hata et al. | | |
| 6,903,374 B2* | 6/2005 | Katayama | ..................... | 257/79 |
| 6,977,395 B2* | 12/2005 | Yamada et al. | ................ | 257/99 |
| 7,652,295 B2* | 1/2010 | Cho et al. | ......................... | 257/79 |
| 7,687,822 B2* | 3/2010 | Nagai et al. | ..................... | 257/99 |
| 7,763,898 B2* | 7/2010 | Tanaka et al. | .................... | 257/87 |
| 7,893,451 B2* | 2/2011 | Cho et al. | ......................... | 257/98 |
| 7,939,840 B2* | 5/2011 | Cho et al. | ......................... | 257/95 |
| 8,003,993 B2* | 8/2011 | Cho et al. | ......................... | 257/79 |
| 8,076,688 B2* | 12/2011 | Kim et al. | ......................... | 257/98 |
| 8,101,964 B2* | 1/2012 | Kitagawa et al. | ............... | 257/99 |
| 8,120,057 B2* | 2/2012 | Sano et al. | ....................... | 257/99 |
| 8,258,541 B2* | 9/2012 | Muraki et al. | ................ | 257/103 |
| 8,263,985 B2* | 9/2012 | Choi | ............................... | 257/79 |
| 2004/0012013 A1 | 1/2004 | Katayama | | |
| 2004/0046166 A1 | 3/2004 | Cho et al. | | |
| 2005/0173714 A1* | 8/2005 | Lee et al. | ........................ | 257/84 |

(Continued)

FOREIGN PATENT DOCUMENTS

| | | |
|---|---|---|
| CN | 1588652 | 3/2005 |
| CN | 1866569 | 11/2006 |

(Continued)

OTHER PUBLICATIONS

Korean Notice of Allowance dated Nov. 28, 2011 for Application 10-2009-0121121.

(Continued)

*Primary Examiner* — Evan Pert
(74) *Attorney, Agent, or Firm* — KED & Associates, LLP

(57) ABSTRACT

A light emitting device may include a light emitting structure including a first conductive semiconductor layer, an active layer on the first conductive semiconductor layer, and a second conductive semiconductor layer on the active layer. A first electrode including a plurality of openings may be provided on the light emitting structure. A filling factor, which is an area ratio of the first electrode relative to an area of a top surface of the light emitting structure, may be 20% or less.

12 Claims, 9 Drawing Sheets

(56) References Cited

U.S. PATENT DOCUMENTS

| | | | |
|---|---|---|---|
| 2005/0173717 A1* | 8/2005 | Lee et al. ............... | 257/98 |
| 2006/0192194 A1 | 8/2006 | Erchak et al. | |
| 2006/0226429 A1 | 10/2006 | Sigalas | |
| 2006/0270206 A1 | 11/2006 | Cho et al. | |
| 2006/0284195 A1* | 12/2006 | Nagai ................... | 257/98 |
| 2007/0131941 A1* | 6/2007 | Tanaka et al. ......... | 257/79 |
| 2007/0181895 A1* | 8/2007 | Nagai ................... | 257/98 |
| 2007/0194336 A1 | 8/2007 | Shin et al. | |
| 2007/0257269 A1* | 11/2007 | Cho et al. ............. | 257/95 |
| 2008/0017878 A1* | 1/2008 | Kuramoto .............. | 257/99 |
| 2008/0048194 A1* | 2/2008 | Kudo et al. ............ | 257/94 |
| 2008/0093612 A1 | 4/2008 | Konno et al. | |
| 2008/0277679 A1* | 11/2008 | Akimoto ................ | 257/94 |
| 2009/0184329 A1 | 7/2009 | Miki et al. | |
| 2009/0250716 A1 | 10/2009 | Haberern et al. | |
| 2009/0267105 A1* | 10/2009 | Yu et al. ............... | 257/99 |
| 2010/0051970 A1 | 3/2010 | Ouderkirk et al. | |
| 2010/0171136 A1 | 7/2010 | Sakai et al. | |
| 2010/0187559 A1* | 7/2010 | Han .................... | 257/99 |
| 2011/0018022 A1 | 1/2011 | Okabe et al. | |
| 2011/0049556 A1* | 3/2011 | Fujimoto et al. ...... | 257/99 |
| 2011/0204325 A1* | 8/2011 | Kim .................... | 257/13 |
| 2011/0241064 A1* | 10/2011 | Fang et al. ............ | 257/99 |
| 2012/0012874 A1* | 1/2012 | Morioka et al. ....... | 257/98 |
| 2012/0091499 A1* | 4/2012 | Kitagawa et al. ...... | 257/99 |
| 2012/0228658 A1* | 9/2012 | Sasaki et al. .......... | 257/98 |

FOREIGN PATENT DOCUMENTS

| | | |
|---|---|---|
| CN | 1993837 | 7/2007 |
| JP | 2003-152221 A | 5/2003 |
| JP | 2007-287851 | 1/2007 |
| JP | 2008-103627 A | 5/2008 |
| KR | 10-2004-0008092 A | 1/2004 |
| KR | 10-2004-0022703 | 3/2004 |
| KR | 10-2005-0008035 | 1/2005 |
| KR | 10-2005-0008259 | 1/2005 |
| KR | 10-0648444 A | 11/2006 |
| KR | 10-2007-0041506 | 4/2007 |
| KR | 10-2007-0043982 | 4/2007 |
| KR | 10-2007-0117336 A | 12/2007 |
| KR | 10-2008-0826375 B1 | 5/2008 |
| KR | 10-0847847 | 7/2008 |
| KR | 10-0850667 B1 | 7/2008 |
| KR | 10-2009-0053307 A | 5/2009 |
| KR | 10-2009-0119749 | 11/2009 |
| KR | 10-2010-0133997 | 12/2010 |
| WO | WO 2009/139524 | 11/2009 |

OTHER PUBLICATIONS

Korean Office Action dated Mar. 2, 2011. (10-2009-0089902).
Korean Office Action dated Jun. 23, 2011. (10-2009-0089902).
Office Action issued U.S. Appl. No. 12/793,781 dated May 15, 2012.
Chinese Office Action dated May 24, 2012.
Office Action issued U.S. Appl. No. 12/793,781 dated Oct. 23, 2012.
Chinese Office Action dated Nov. 15, 2012.
Office Action issued U.S. Appl. No. 12/793,781 dated Feb. 13, 2013.

* cited by examiner

LIGHT EMITTING DEVICE, LIGHT EMITTING DEVICE PACKAGE AND LIGHTING SYSTEM

CROSS-REFERENCE TO RELATED APPLICATION

This application claims priority benefit under 35 U.S.C. §119 from Korean Patent Application No. 10-2009-0121121, filed Dec. 8, 2009, the subject matter of which is hereby incorporated by reference.

BACKGROUND

1. Field

Embodiments may relate to a light emitting device, a light emitting device package, and/or a lighting system.

2. Background

A light emitting device (LED) may include a p-n junction diode having a characteristic of converting electric energy into light energy. The p-n junction diode may be formed by combining group III-V elements of a periodic table. The LED may represent various colors by adjusting a compositional ratio of compound semiconductors.

The LED may be classified as a lateral type LED or a vertical type LED based on position of an electrode.

The electrode of the vertical type LED may be divided into a p type electrode and an n type electrode. The p type electrode may supply holes and represent low mobility due to a great effective mass of the holes so that the p type electrode may be formed over the whole area of a p-GaN layer.

The n type electrode may be positioned at a light exit surface so that the n type electrode is on a part of an N—GaN surface. Although the n type electrode is partially formed on the N—GaN surface, electrons may freely move in the n-GaN layer so that current may normally flow without causing serious problem.

However, light quantity or electric characteristics, such as operational voltage, may vary depending on area or shape of the n type electrode. For this reason, the n type electrode of the vertical type LED may employ a structure capable of maximizing wall-plug efficiency by taking light quantity and operational voltage characteristics into consideration.

The operational voltage characteristic may be improved as the area of the n type electrode is increased. However, light quantity may be reduced as the area of the n type electrode increases because the n type electrode has limited reflectivity.

Even if the n type electrode is an ideal reflective layer having reflectivity of 100%, light reflected from the n type electrode may be introduced again into the device and absorbed in the device so that the light quantity may be reduced. Thus, it may be desirable to develop the n type electrode capable of improving the light quantity while satisfying the operational voltage characteristic.

BRIEF DESCRIPTION OF THE DRAWINGS

Arrangements and embodiments may be described in detail with reference to the following drawings in which like reference numerals refer to like elements and wherein.

DETAILED DESCRIPTION

A light emitting device, a light emitting device package, and/or a lighting system according to embodiments may be described in detail with reference to accompanying drawings.

It may be understood that when a layer (or film) is referred to as being "on" or "adjacent" another layer or substrate, it may be directly on another layer or substrate, and/or intervening layers may also be present. Further, it may be understood that when a layer is referred to as being 'under' another layer, it may be directly under another layer, and one or more intervening layers may also be present. Additionally, it may also be understood that when a layer is referred to as being 'between' two layers, it may be the only layer between the two layers, and/or one or more intervening layers may also be present.

Figure 1:
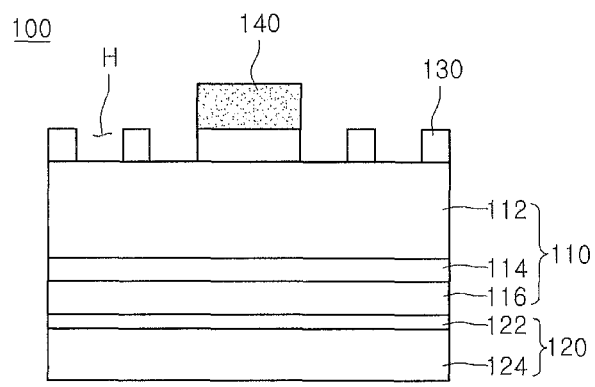
FIG. 1 is a sectional view showing a light emitting device according to an embodiment.
Figure 2:
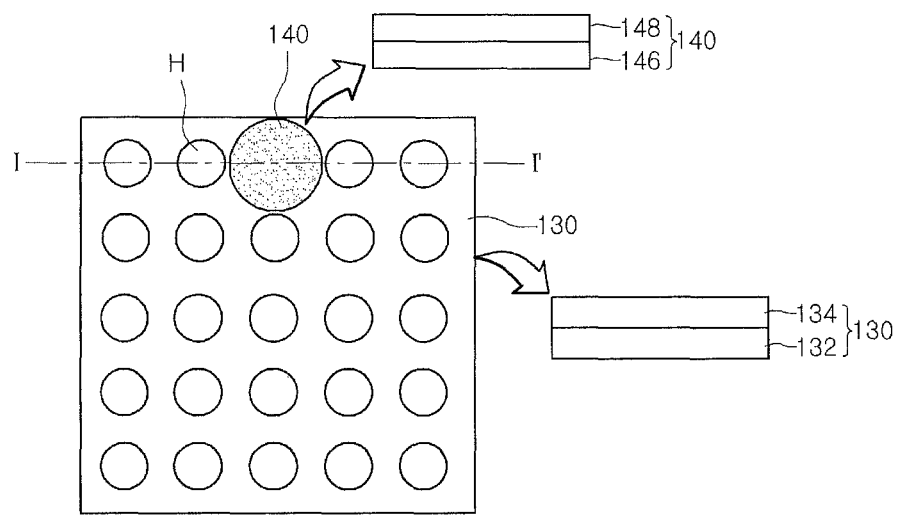
FIGS. 2 and 3 are plan views showing a light emitting device with partially enlarged sections according to embodiments.
Figure 3:
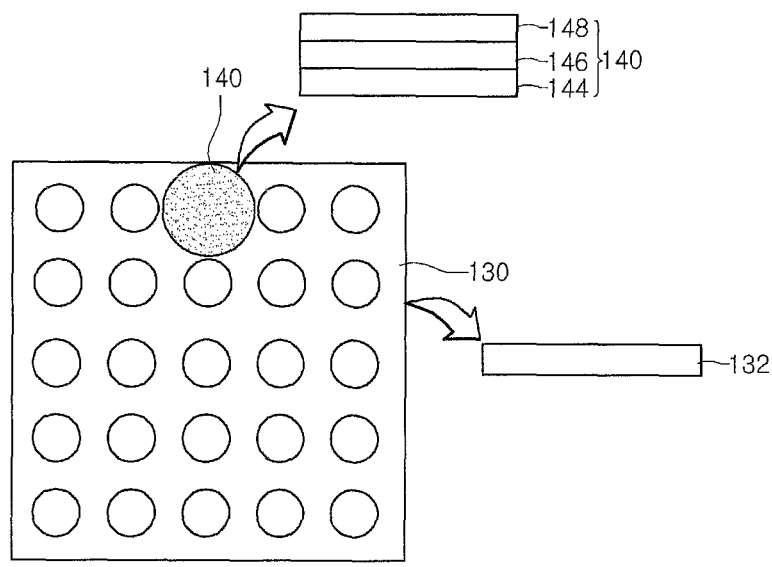

FIG. 1 is a sectional view showing a light emitting device according to an embodiment. FIGS. 2 and 3 are plan views showing a light emitting device with partially enlarged sections according to embodiments. Other embodiments and configurations may also be provided.

The light emitting device 100 may include a light emitting structure 110, a first electrode 130 formed on the light emitting structure 110, and a pad electrode 140 formed on the first electrode 130. The first electrode 130 may include a surface having a plurality of openings provided thereon. The plurality of openings may be considered a pattern H, which may be uniform or non-uniform over the surface of the first electrode 130. A filling factor is an area ratio of the first electrode 130 relative to an area of a top surface of the light emitting structure 110. The filling factor may be approximately 20% or less.

Figure 14:
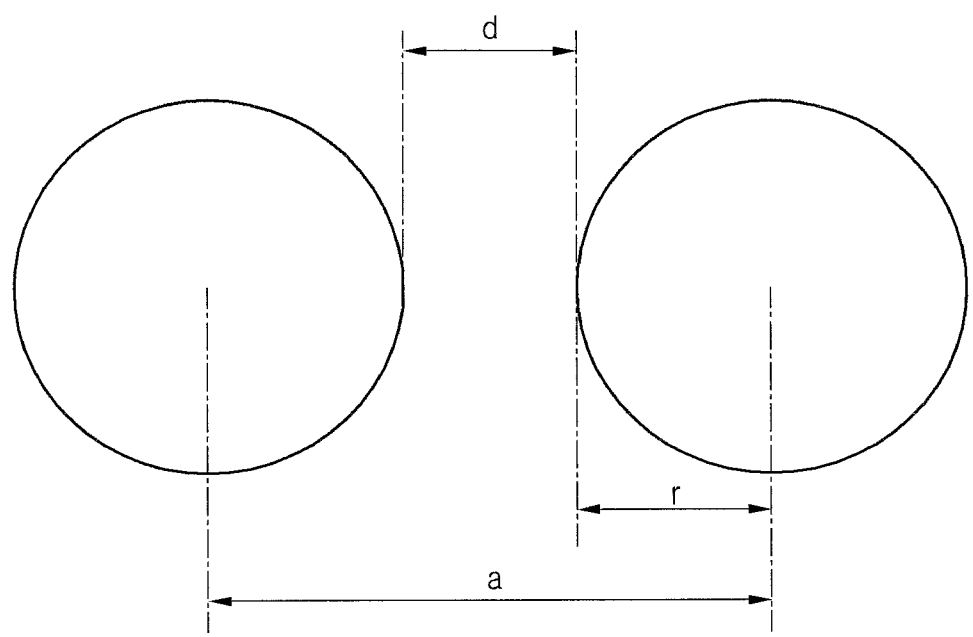
FIG. 14 shows two adjacent openings and parameters relating to spacing and size according to example embodiments.

The openings may have a circular shape. The openings may have a radius of 0.45×a or more, where a is a distance between centers of two adjacent openings. FIG. 14 shows two adjacent openings having a radius of r. A distance d between the two adjacent openings may be 0.1×a or less.

The filling factor may be uniform over a whole area of a top surface of the light emitting structure 110.

The first electrode 130 may include a first ohmic layer 132. As shown in FIG. 3, the first ohmic layer 132 may include a transparent ohmic layer, although embodiments are not limited thereto. Additionally, the first ohmic layer 132 including the transparent ohmic layer may have a thickness of approximately 10 nm or less, although embodiments are not limited thereto. The first ohmic layer 132 may include at least one selected from the group consisting of Cr, Pt, Ni, and Au.

As shown in FIG. 2, the first electrode 130 may include a first reflective layer 134 formed on the first ohmic layer 132.

The first electrode 130 may include the periodic or non-periodic openings (or patterns H), which may be obtained by dry-etching or wet-etching electrode metal deposited on the whole area of the light emitting structure 110.

The first electrode 130 may be uniformly distributed over the whole area of an upper end portion of the light emitting structure 110 so that current may be uniformly diffused. As a result, the light may be uniformly emitted from the whole area of a light emitting layer (active layer) so that reliability of a high-power LED may be improved.

The first electrode 130 may serve as a light extraction structure due to the periodic or non-periodic openings (or pattern H) formed in a planar metal layer.

In disadvantageous arrangements, the n type electrode may only have a role of a reflective mirror. However, according to an embodiment, the first electrode 130 may partially extract light to the outside through the openings (or pattern H) formed at a boundary surface between metal and a dielectric substance provided in the opening (or pattern H).

According to an embodiment, the opening (or pattern H) formed at the boundary surface between the metal and a dielectric substance may represent superior light extraction characteristics as compared with an opening (or pattern H) formed at a boundary surface between typical dielectric substances. This may be because the light extraction efficiency may be proportional to a difference in a refractive index between two layers adjacent to each other about the boundary surface.

Figure 4:
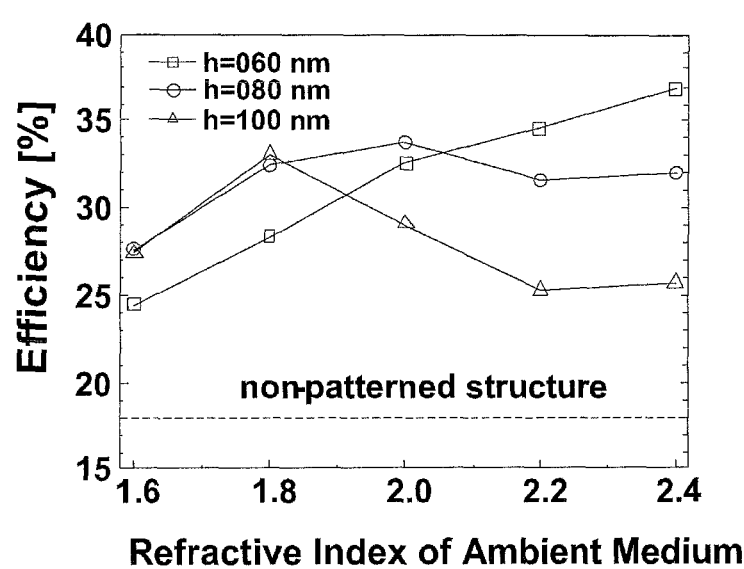
FIG. 4 is a graph showing a light extraction efficiency of a light emitting device according to an embodiment.

FIG. 4 is a graph showing a light extraction efficiency of a light emitting device according to an embodiment. FIG. 4 shows the light extraction efficiency according to a refractive index of the dielectric substance and the pattern height (h) when the pattern H having a size of 400 nm is formed at the boundary surface between the metal and the dielectric substance. In the graph, dotted lines may represent the light extraction efficiency when the pattern H is not formed.

When the light extraction efficiency is calculated through the electromagnetic equation in a state in which the openings (or patterns) are formed at the boundary surface between the metal and the dielectric substance of the first electrode 130, the light extraction efficiency may be significantly improved as compared with the light extraction efficiency (about 18%) under the condition of the non-openings (or non-patterned) structure. In particular, the height of the pattern suitable for maximizing the light extraction efficiency may vary depending on a refractive index of the ambient medium.

Figure 5:
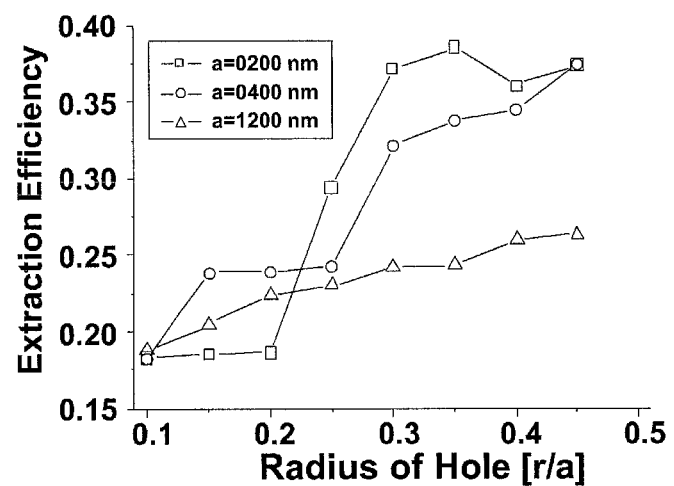
FIG. 5 is a graph showing a light extraction efficiency as a function of a pattern size of a light emitting device according to an embodiment.

FIG. 5 is a graph showing the light extraction efficiency according to an opening size of the light emitting device according to an embodiment. That is, FIG. 5 shows the light extraction efficiency according to a period (a) of the pattern H and a radius of the opening. Stated differently and as shown in FIG. 14, "a" may represent a distance between centers of two adjacent openings, and a radius r of at least one of the two adjacent openings is equal to or greater than 0.45×a. Accordingly, a distance d between the two adjacent openings may be equal to or less than 0.1×a.

According to the embodiment, if the size or radius of the opening is about 0.45×a or greater, then the light extraction efficiency may be maximized regardless of the period of the openings, although embodiments are not limited thereto.

According to the light emitting device and the light emitting device package of the embodiment, the n type electrode may be obtained by forming a pattern of openings having a predetermined period in a planar metal layer, so that the current may be easily diffused and light extraction efficiency may be improved.

The n type electrode may be obtained by forming a thin transparent metal layer over the whole area of the n type electrode except for a region where a wire bonding pad is formed, so that the n type electrode may improve the light quantity while satisfying the operational voltage characteristic.

The filling factor of the pattern of openings may change based on a relative distance with respect to the pad electrode in order to minimize absorption loss caused by the first electrode.

A method for manufacturing a light emitting device according to an embodiment may be described with reference to FIGS. 6 to 9.

The light emitting device may include GaN, GaAs, GaAsP, and/or GaP. For example, green-blue LEDs may include GaN (InGaN) and yellow-red LEDs may include InGaAIP or AlGaAs. Additionally, full color may be realized by adjusting a composition of the above material.

Figure 6:
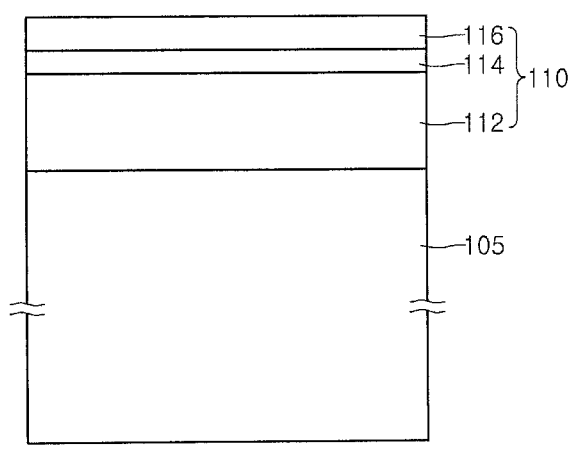
FIGS. 6 to 9 are sectional views showing a method for manufacturing a light emitting device according to an embodiment.

As shown in FIGS. 1 and 6, the light emitting structure 110 may include a first conductive semiconductor layer 112, an active layer 114 and a second semiconductor layer 116. In order to form the light emitting structure 110, a first substrate 105 may be provided as shown in FIG. 6.

The first substrate 105 may include a conductive substrate or an insulating substrate. For example, the first substrate 105 may include at least one of $Al_2O_3$, SiC, Si, GaAs, GaN, ZnO, Si, GaP, InP, Ge, and/or $Ga_2O_3$. A concave-convex structure may be formed on the first substrate 105, although embodiments are not limited thereto.

The first substrate 105 may be subject to wet cleaning to remove impurities from the surface of the first substrate 105.

The light emitting structure 110 (including the first conductive semiconductor layer 112, the active layer 114 and the second semiconductor layer 116) may be formed on the first substrate 105.

For example, the light emitting structure 110 may be formed through MOCVD (Metal Organic Chemical Vapor Deposition), CVD (Chemical Vapor Deposition), PECVD (Plasma-Enhanced Chemical Vapor Deposition), MBE (Molecular Beam Epitaxy), and/or HVPE (Hydride Vapor Phase Epitaxy), although embodiments are not limited thereto.

A buffer layer (not shown) may be formed on the first substrate 105. The buffer layer may attenuate lattice mismatch between the light emitting structure 110 and the first substrate 105. The buffer layer may include a group III-V compound semiconductor. For example, the buffer layer may include at least one of GaN, InN, AlN, InGaN, AlGaN, InAlGaN, and AlInN. An undoped semiconductor layer may be formed on the buffer layer, although embodiments are not limited thereto.

The first conductive semiconductor layer 112 may include a group III-V compound semiconductor doped with a first conductive dopant. If the first conductive semiconductor layer 112 is an N type semiconductor layer, the first conductive dopant may be an N type dopant, such as Si, Ge, Sn, Se, or Te, although embodiments are not limited thereto.

The first conductive semiconductor layer 112 may include semiconductor material having the compositional formula of $In_xAl_yGa_{1-x-y}N$ ($0 \leq x \leq 1$, $0 \leq y \leq 1$, $0 \leq x+y \leq 1$).

The first conductive semiconductor layer 112 may include at least one of GaN, InN, AlN, InGaN, AlGaN, InAlGaN, AlInN, AlGaAs, InGaAs, AlInGaAs, GaP, AlGaP, InGaP, AlInGaP, and/or InP.

The first conductive semiconductor layer 112 may include an N type GaN layer, which may be formed through CVD, MBE, sputtering and/or HVPE. Additionally, the first conductive semiconductor layer 112 may be formed by injecting trimethyl gallium (TMGa) gas, ammonia ($NH_3$) gas, nitrogen ($N_2$) gas and silane ($SiH_4$) gas including n type impurities, such as silicon, into a chamber.

Electrons injected through the first conductive semiconductor layer 112 may meet holes injected through the second conductive semiconductor layer 116 at the active layer 114, so that the active layer 114 may emit light having energy determined based on an intrinsic energy band of the active layer (light emitting layer) 114.

The active layer 114 may include at least one of a single quantum well structure, a multiple quantum well (MQW) structure, a quantum wire structure and/or a quantum dot structure. For example, the active layer 114 may be formed with the MQW structure by injecting TMGa gas, NH$_3$ gas, N$_2$ gas, and trimethyl indium (TMIn) gas, although embodiments are not limited thereto.

The active layer 114 may have a well/barrier layer including at least one of InGaN/GaN, InGaN/InGaN, AlGaN/GaN, InAlGaN/GaN, GaAs/AlGaAs (InGaAs) and GaP/AlGaP (InGaP), although embodiments are not limited thereto. The well layer (of the active layer 114) may include material having a band gap energy lower than the barrier layer (of the active layer 114).

A conductive clad layer (not shown) may be formed on and/or under the active layer 114. The conductive clad layer may include an AlGaN-based semiconductor having a band gap energy higher than the active layer 114.

The second conductive semiconductor layer 116 may include the group III-V compound semiconductor doped with the second conductive dopant. For example, the second conductive semiconductor layer 116 may include the semiconductor material having the compositional formula of In$_x$Al$_y$Ga$_{1-x-y}$N (0≦x≦1, 0≦y≦1, 0≦x+y≦1). The second conductive semiconductor layer 116 may include one selected from the group consisting of GaN, AlN, AlGaN, InGaN, InN, InAlGaN, AlInN, AlGaAs, GaP, GaAs, GaAsP, and AlGaInP. If the second conductive semiconductor layer 116 is a P type semiconductor layer, then the second conductive dopant may include the P type dopant such as Mg, Zn, Ca, Sr, or Ba. The second conductive semiconductor layer 116 may be prepared as a single layer or multiple layers, although embodiments are not limited thereto.

The second conductive semiconductor layer 116 may include a p type GaN layer that may be formed by injecting TMGa gas, NH$_3$ gas, N$_2$ gas and (EtCp$_2$Mg){Mg(C$_2$H$_5$C$_5$H$_4$)} gas including p type impurities (for example, Mg) into the chamber, although embodiments are not limited thereto.

The first conductive semiconductor layer 112 may include an N type semiconductor layer and the second conductive semiconductor layer 116 may include a P type semiconductor layer, although embodiments are not limited thereto. Additionally, a semiconductor layer, such as an N type semiconductor layer (not shown) having polarity opposite to that of the second conductive semiconductor layer 116, may be formed on the second conductive semiconductor layer 116. The light emitting structure 110 may include at least one of an N—P junction structure, a P—N junction structure, an N—P—N junction structure, and/or a P—N—P junction structure.

Figure 7:
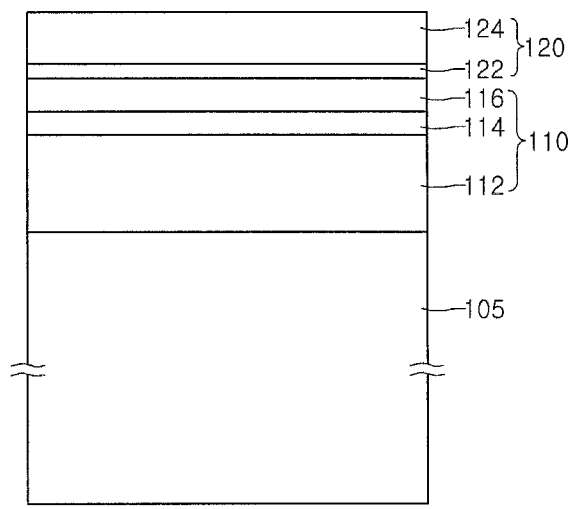

As shown in FIG. 7, the second electrode layer 120 may be formed on the second conductive semiconductor layer 116.

The second electrode layer 120 may include a second ohmic layer 122, a second reflective layer (not shown), a second junction layer (not shown) and a conductive support substrate 124.

For example, the ohmic layer 122 of the second electrode layer 120 may come into ohmic contact with the light emitting structure to supply power to the light emitting structure 110.

The ohmic layer 122 may be prepared as multiple layers by stacking a single metal, a metal alloy, and/or metal oxide.

For example, the ohmic layer 122 may include at least one selected from the group consisting of ITO (indium tin oxide), IZO (indium zinc oxide), IZTO (indium zinc tin oxide), IAZO (indium aluminum zinc oxide), IGZO (indium gallium zinc oxide), IGTO (indium gallium tin oxide), AZO (aluminum zinc oxide), ATO (antimony tin oxide), GZO (gallium zinc oxide), IZON (IZO nitride), AGZO (Al—Ga ZnO), IGZO (In—Ga ZnO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Ru, Mg, Zn, Pt, Au, and Hf, although embodiments are not limited thereto.

The second electrode layer 120 may include a reflective layer (not shown) to reflect the light incident from the light emitting structure 110, thereby improving the light extraction efficiency.

For example, the reflective layer may include a metal or a metal alloy including at least one selected from the group consisting of Ag, Ni, Al, Rh, Pd, Ir, Ru, Mg, Zn, Pt, Au, and Hf. Additionally, the reflective layer may be prepared as multiple layers by using the above metal or metal alloy and a transmissive conductive material, such as IZO, IZTO, IAZO, IGZO, IGTO, AZO, and/or ATO. For example, the reflective layer may have a stack structure including IZO/Ni, AZO/Ag, IZO/Ag/Ni, and/or AZO/Ag/Ni.

Additionally, if the second electrode layer 120 includes the junction layer, the reflective layer may serve as a bonding layer or may include a barrier metal or a bonding metal. For example, the junction layer may include at least one selected from the group consisting of Ti, Au, Sn, Ni, Cr, Ga, In, Bi, Cu, Ag and Ta.

The second electrode 120 may include the conductive support substrate 124. The conductive support substrate 124 may support the light emitting structure 110 to provide power to the light emitting structure 110. The conductive support substrate 124 may include metal having superior electric conductivity, a metal alloy and/or a conductive semiconductor material.

The conductive support substrate 124 may include at least one selected from the group consisting of Cu, a Cu alloy, Au, Ni, Mo, Cu—W, and a carrier wafer, such as Si, Ge, GaAs, GaN, ZnO, SiGe, and SiC.

The conductive support substrate 124 may have a thickness of approximately 30 µm to 500 µm, which may vary depending on design rule of the light emitting device.

The conductive support substrate 124 may be formed through a electrochemical metal deposition scheme, a plating scheme or the bonding scheme using eutectic metal.

Figure 8:
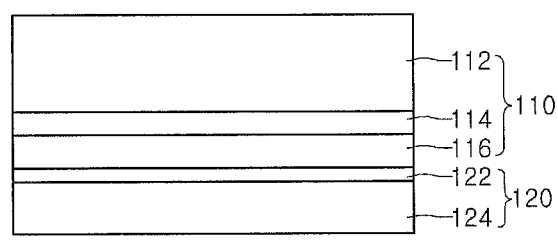

As shown in FIG. 8, the first substrate 105 may be removed such that the first conductive semiconductor layer 112 can be exposed. The first substrate 105 may be removed through a laser lift off scheme or a chemical lift off scheme. Additionally, the first substrate 105 may be removed by physically grinding the first substrate 105.

Figure 9:
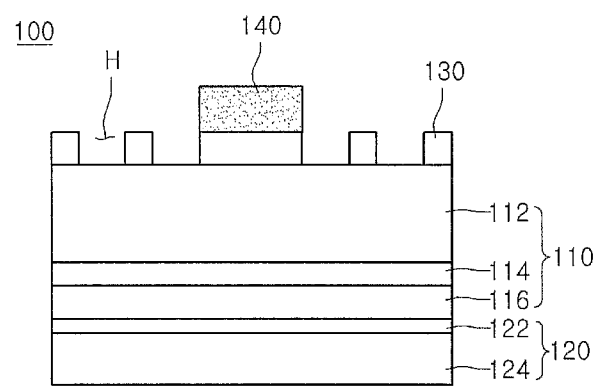

As shown in FIG. 9, the first electrode 130 including the pattern H of openings may be formed on the light emitting structure 110. A surface roughness (not shown) or a periodic surface structure (not shown) may be formed on the light emitting structure 110 before the first electrode 130 is formed.

The first electrode 130 including the plurality of openings (or the pattern H) may be formed by patterning first electrode material (not shown) through wet or dry etching after forming the first electrode material on the light emitting structure 110.

As shown in FIG. 2, the first electrode 130 may be formed by forming the first ohmic layer 132 on the light emitting structure 110 and then forming the first reflective layer 134 on the first ohmic layer 132.

FIGS. 2-3 are plan views showing a light emitting device with partially enlarged sections according to embodiments.

As shown in FIG. 3, the first electrode 130 may include the first ohmic layer 132 without the reflective layer. The first ohmic layer 132 may include a transparent ohmic layer.

The first ohmic layer 132 including the transparent ohmic layer may have a thickness of approximately 10 nm or less and may include at least one of Cr, Pt, Ni, and Au, although embodiments are not limited thereto.

The openings (or the pattern H) of the first electrode 130 may have a periodic two-dimensional structure, such as a triangular lattice structure, a rectangular lattice structure, an Archimedean lattice structure and/or a quasi-crystal structure. Further, the openings (or the pattern H) may have an irregular random pattern in addition to the periodic pattern or alternately from the periodic pattern.

The openings (or the pattern H) of the first electrode 130 may include holes connected to each other for current diffusion. The holes may be in the shape of circles, for example. The holes may also be in the shape of polygons. The holes may be in other shapes, or any combination thereof.

The openings may be filled with at least one of air, epoxy and/or dielectric substance. If the openings are filled with the dielectric substance, the dielectric substance may have a refractive index higher than 1 and lower than 3. If the openings are filled with air, a resist layer or an insulating material may be formed on the pattern area and additional material may be formed on the first electrode 130. Then, the resist layer or the insulating material may be selectively removed.

The period of the openings (of the pattern H) may be approximately 100 nm to approximately 5000 nm. Additionally, the filling factor of the first electrode 130 with respect to the area of the top surface of the LED chip may be approximately 20% or less.

The filling factor of the openings (or the pattern H), which is an area ratio of the first electrode 130 relative to the area of the top surface of the light emitting structure 110, may be approximately 20% or less. The first electrode 130 may improve current diffusion and light extraction efficiency while satisfying operational voltage characteristic.

The openings may be prepared as a hole because the openings (of the pattern H) may have spatial continuity for current diffusion, although embodiments are not limited thereto. When taking into consideration light extraction efficiency resulting from the openings (of the pattern H) of the first electrode 130, a radius of the hole may be 0.45×a or greater, where a is a distance between centers of two adjacent openings. Accordingly, a distance d between two holes/openings may be 0.1×a or less.

Additionally, the filling factor of the first electrode 130 may be reduced as a size of the opening increases, so absorption loss caused by the first electrode 130 may be reduced. When the openings (or the pattern H) are arranged in the form of the triangular lattice, the filling factor of the opening pattern having the radius size of 0.45×a may be approximately 20% or less, so light extraction efficiency may be improved even if the area ratio of the typical n type electrode is applied to the first electrode 130.

The pad electrode 140 may be formed on the first electrode 130.

As shown in FIG. 2, the pad electrode 140 may include a third junction layer 146 to form a metal interfacial junction for current diffusion and a bonding layer 148 for wire bonding, although embodiments are not limited thereto.

For example, the bonding layer and the junction layer may be omitted from the first electrode 130 having the pattern H shown in FIG. 2 except for the area where the pad electrode 140 is formed. For example, the first electrode 130 may include the first ohmic layer 132 and the first reflective layer 134. The pad electrode 140 may include the third junction layer 146. The third junction layer 146 may be formed by using Ni or Au. Additionally, the pad electrode 140 may include the bonding layer 148 including Au.

As shown in FIG. 3, the reflective layer may be omitted from the first electrode 130. For example, if only the first ohmic layer 132 is formed on the first electrode 130 except for the region where the pad electrode 140 is formed, the first ohmic layer 132 may serve as a transparent ohmic layer by reducing the thickness of the first ohmic layer 132 to approximately 10 nm or less. In this example, the pad electrode 144 may further include the third reflective layer 144 for reflecting the light. The third reflective layer 144 may include a metal layer. In this example, the metal layer may include Al, Ag or an alloy including Al or Ag.

The first electrode may be obtained by forming a predetermined pattern in a planar metal layer so that the current may be easily diffused and light extraction efficiency may be improved.

The first electrode may be obtained by forming a thin transparent metal layer over the whole area of the first electrode except for a region where a wire bonding pad is formed, so that the first electrode may improve light quantity while satisfying the operational voltage characteristic.

Figure 10:
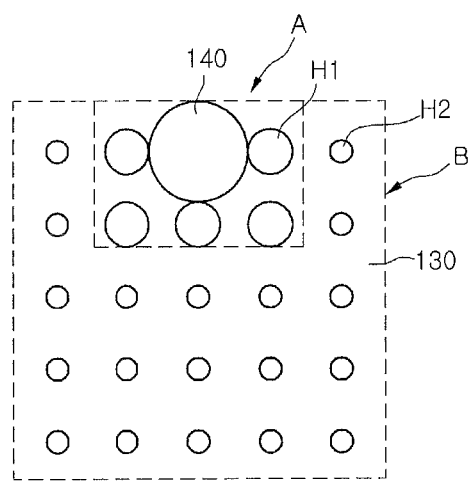
FIG. 10 is a plan view showing a light emitting device according to an embodiment.

FIG. 10 is a plan view showing a light emitting device according to an embodiment. Other embodiments and configurations may also be provided.

This embodiment may adopt technical features of the previous embodiments and the following description may be focused on differences with respect to the previous embodiment.

According to this embodiment, the filling factor may not be uniform over the whole area of the top surface of the light emitting structure 110. For example, the filling factor at a first region A, which is spaced apart from the pad electrode 140 by a first distance, may be less than the filling factor at a second region B, which is spaced apart from the pad electrode 140 by a second distance greater than the first distance.

That is, the openings (of the pattern H) of the first electrode 130 may not have a uniform filling factor over a whole area of the first electrode 130 by taking the current diffusion effect into consideration.

First openings (or patterns H1) having a large hole size may be formed on the first area A or the openings may not be formed on the first area A adjacent to the pad electrode 140. Additionally, the opening size may gradually decrease in the second area B away from (or remote from) the pad electrode 140. That is, second openings (of the patterns H2) having the reduced hole size may be formed on the second area B.

Therefore, according to the FIG. 10 embodiment, light extraction efficiency may be improved while reducing the filling factor of the pattern relative to the top surface of the first electrode 130.

The first electrode may be obtained by forming a predetermined pattern in a planar metal layer so that current may be easily diffused and light extraction efficiency may be improved.

Further, the filling factor of the pattern may change according to a relative distance with respect to the pad electrode in order to minimize absorption loss caused by the first electrode.

Figure 11:
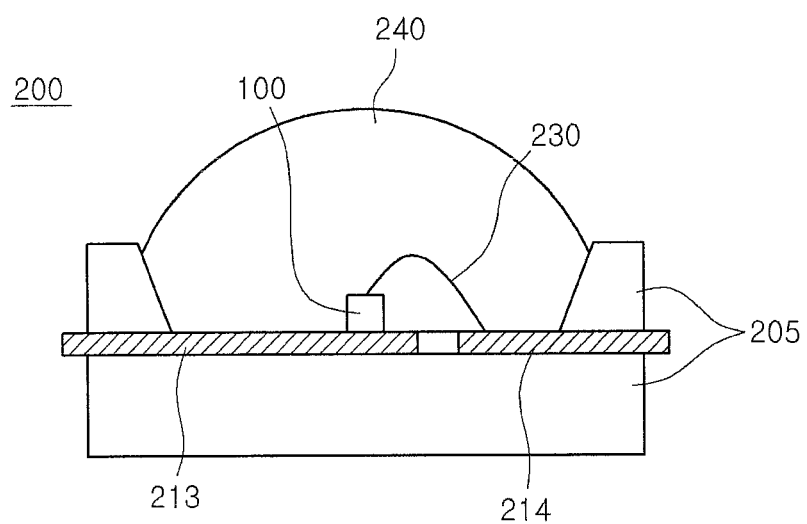
FIG. 11 is a sectional view showing a light emitting device package according to an embodiment.

FIG. 11 is a view showing a light emitting device package including a light emitting device according to an embodiment.

As shown in FIG. 11, a light emitting device package 200 may include a package body 205, third and fourth electrode layers 213 and 214 formed on the package body 205, the light emitting device 100 provided on the package body 205 and electrically connected to the third and fourth electrode layers 213 and 214 and a molding member 240 that surrounds the light emitting device 100.

The package body 205 may include silicon, synthetic resin and/or a metallic material. An inclined surface may be formed around the light emitting device 100.

The third and fourth electrode layers 213 and 214 may be electrically isolated from each other to supply power to the light emitting device 100. Additionally, the third and fourth electrode layers 213 and 214 may reflect the light emitted from light emitting device 100 to improve the light efficiency and dissipate heat generated from the light emitting device 100 to the outside.

The vertical type light emitting device shown in FIG. 1 may be employed as the light emitting device 100, although embodiments are not limited thereto. For example, a lateral type light emitting device may be used as the light emitting device 100.

The light emitting device 100 may be installed on the package body 205 or the third and fourth electrode layers 213 and 214.

The light emitting device 100 may be electrically connected to the third electrode layer 213 and/or the fourth electrode layer 214 through at least one of a wire bonding scheme, a flip chip bonding scheme and/or a die bonding scheme. The light emitting device 100 may be electrically connected to the third electrode layer 213 through a wire 230 and electrically connected to the fourth electrode layer 214 through the die bonding scheme.

The molding member 240 may surround the light emitting device 100 to protect the light emitting device 100. Additionally, the molding member 240 may include phosphors to change a wavelength of the light emitted from the light emitting device 100.

A plurality of light emitting device packages may be arrayed on a substrate, and an optical member including a light guide plate, a prism sheet, a diffusion sheet and/or a fluorescent sheet may be provided on the optical path of the light emitted from the light emitting device package. The light emitting device package, the substrate, and/or the optical member may serve as a backlight unit or a lighting unit. For example, the lighting system may include a backlight unit, a lighting unit, an indicator, a lamp and/or a streetlamp.

Figure 12:
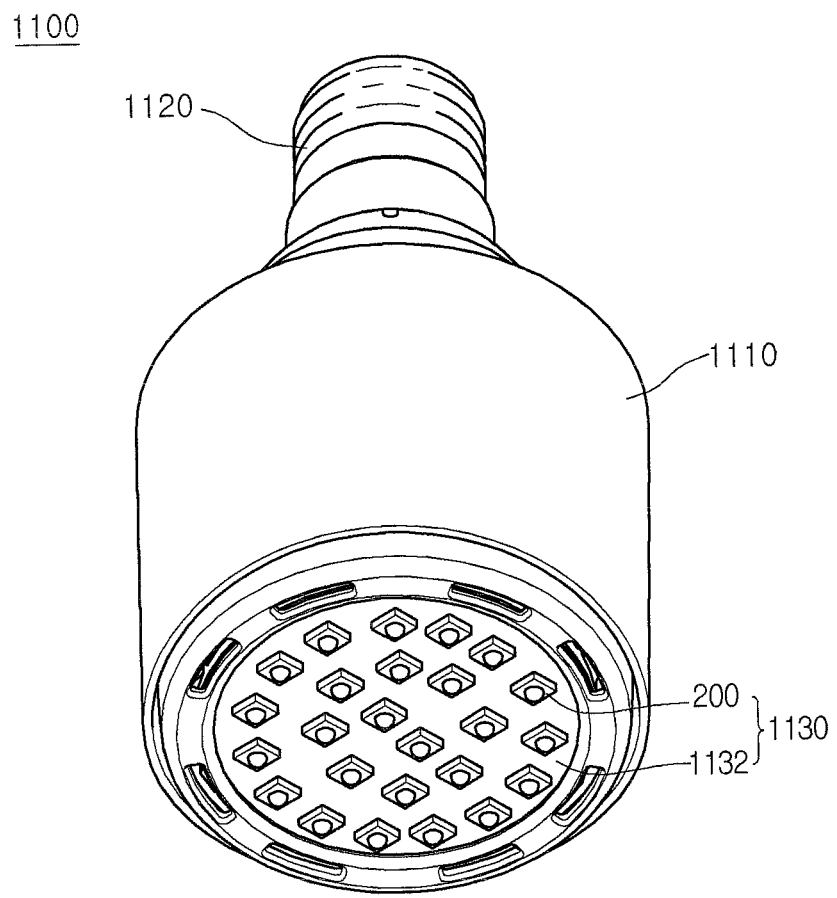
FIG. 12 is a perspective view showing a lighting unit according to an embodiment.

FIG. 12 is a perspective view showing a lighting unit 1100 according to an embodiment. The lighting unit 1100 shown in FIG. 12 is an example of a lighting system, although embodiments are not limited thereto.

As shown in FIG. 12, the lighting unit 1100 may include a case body 1110, a light emitting module 1130 installed in the case body 1110, and a connection terminal 1120 installed in the case body 1110 to receive power from an external power source.

The case body 1110 may include material having superior heat dissipation property. For example, the case body 1110 may include a metallic material or a resin material.

The light emitting module 1130 may include a substrate 1132 and at least one light emitting device package 200 on the substrate 1132.

The substrate 1132 may include an insulating member printed with a circuit pattern. For example, the substrate 1132 may include a PCB (printed circuit board), an MC (metal core) PCB, an F (flexible) PCB, and/or a ceramic PCB.

Additionally, the substrate 1132 may include material that effectively reflects the light. The surface of the substrate 1132 may be coated with a color, such as a white color or a silver color to effectively reflect the light.

At least one light emitting device package 200 may be installed on the substrate 1132. Each light emitting device package 200 may include at least one LED (light emitting diode). The LED may include a colored LED that emits the light having a color of red, green, blue or white and a UV (ultraviolet) LED that emits UV light.

The LEDs of the light emitting module 1130 may be variously arranged to provide various colors and brightness. For example, the white LED, the red LED and the green LED may be arranged to achieve a high color rendering index (CRI).

The connection terminal 1120 may be electrically connected to the light emitting module 1130 to supply power to the light emitting module 1130. As shown in FIG. 12, the connection terminal 1120 may have a shape of a socket screw-coupled with the external power source, although embodiments are not limited thereto. For example, the connection terminal 1120 may be prepared in the form of a pin inserted into the external power source or connected to the external power source through a wire.

Figure 13:
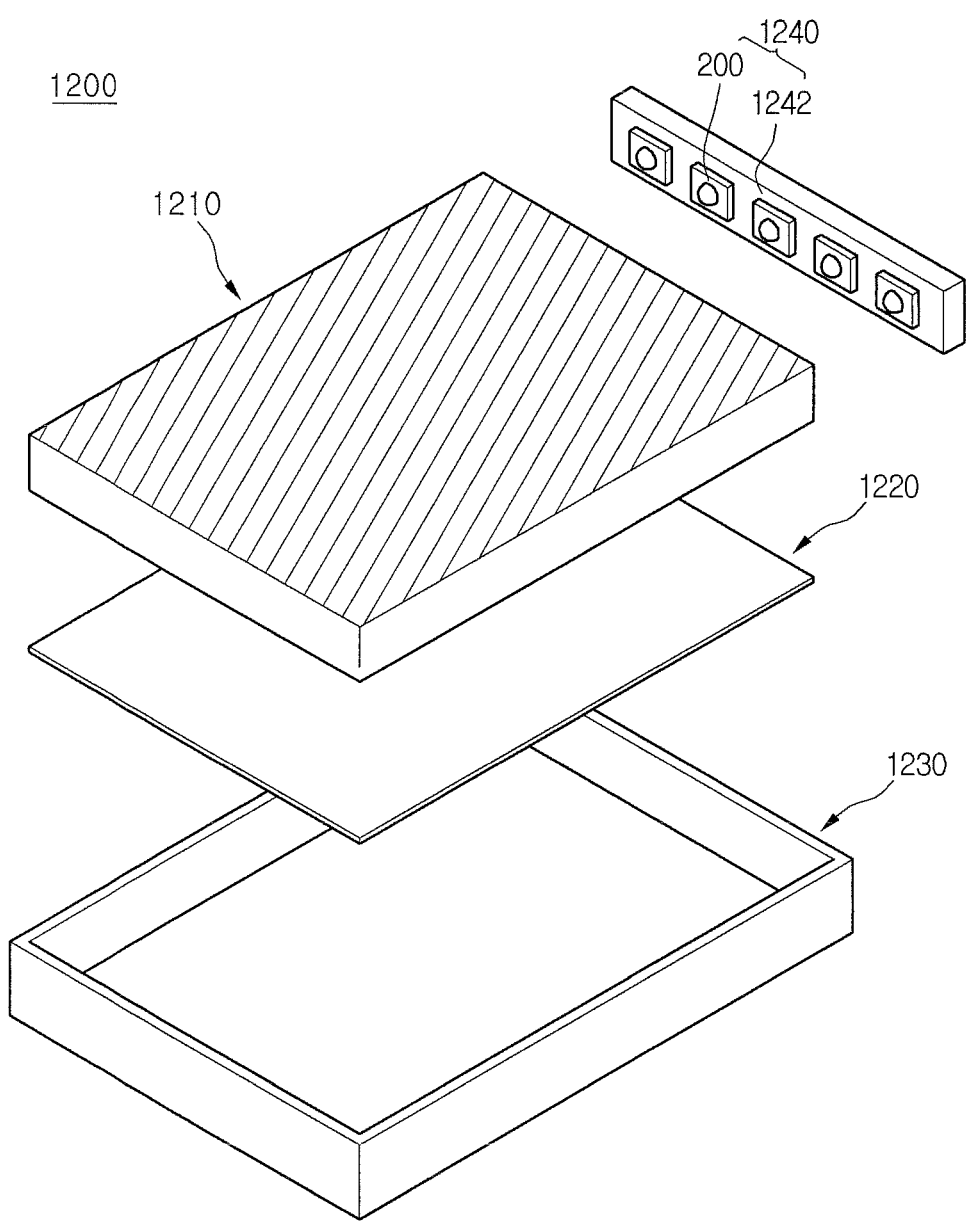
FIG. 13 is an exploded perspective view showing a backlight unit according to an embodiment.

FIG. 13 is an exploded perspective view showing a backlight unit 1200 according to an embodiment. The backlight unit 1200 shown in FIG. 13 is an example of a lighting system, although embodiments are not limited thereto.

The backlight unit 1200 may include a light guide plate 1210, a light emitting module 1240 for providing the light to the light guide plate 1210, a reflective member 1220 positioned below the light guide plate 1210, and a bottom cover 1230 for receiving the light guide plate 1210, the light emitting module 1240, and the reflective member 1220 therein, although embodiments are not limited thereto.

The light guide plate 1210 may diffuse the light to provide surface light. The light guide 1210 may include transparent material. For example, the light guide plate 1210 may be manufactured by using acryl-based resin, such as PMMA (polymethyl methacrylate), PET (polyethylene terephthalate), PC (polycarbonate), COC and/or PEN (polyethylene naphthalate) resin.

The light emitting module 1240 may supply the light to at least one lateral side of the light guide plate 1210 and may serve as the light source of the display device including the backlight unit.

The light emitting module 1240 may be positioned adjacent to the light guide plate 1210, although embodiments are not limited thereto. The light emitting module 1240 may include a substrate 1242 and a plurality of light emitting device packages 200 installed on the substrate 1242, and the substrate 1242 may be adjacent to the light guide plate 1210, although embodiments are not limited thereto.

The substrate 1242 may include a printed circuit board (PCB) having a circuit pattern (not shown). Additionally, the substrate 1242 may also include a metal core PCB (MCPCB) or a flexible PCB (FPCB), although embodiments are not limited thereto.

Additionally, the light emitting device packages 200 may be arranged such that light exit surfaces of the light emitting device packages 200 are spaced apart from the light guide plate 1210 by a predetermined distance.

The reflective member 1220 may be disposed below the light guide plate 1210. The reflective member 1220 may reflect the light, which travels downward through the bottom surface of the light guide plate 1210, toward the light guide plate 1210, thereby improving brightness of the backlight unit. For example, the reflective member 1220 may include PET, PC or PVC resin, although embodiments are not limited thereto.

The bottom cover 1230 may receive the light guide plate 1210, the light emitting module 1240, and the reflective member 1220 therein. The bottom cover 1230 may have a box shape with an open top surface, although embodiments are not limited thereto.

The bottom cover 1230 may be manufactured through a press process or an extrusion process by using a metallic material or a resin material.

As described above, the lighting system may include the light emitting device package so that reliability of the lighting system can be improved.

An embodiment may provide a light emitting device including an electrode capable of improving light quantity while satisfying operational voltage characteristic, a light emitting device package, and/or a lighting system.

A light emitting device may include a light emitting structure including a first conductive semiconductor layer, an active layer over (or on) the first conductive semiconductor layer, and a second conductive semiconductor layer over (or on) the active layer. A first electrode including a pattern (of openings) over (or on) the light emitting structure may also be provided. A pad electrode may be provided over (or on) the first electrode. A filling factor, which is defined as an area ratio of the first electrode relative to an area of a top surface of the light emitting structure, may be 20% or less.

A light emitting device may include a light emitting structure including a first conductive semiconductor layer, an active layer over (or on) the first conductive semiconductor layer, and a second conductive semiconductor layer over (or on) the active layer. A first electrode including a pattern (of openings) may be provided over (or on) the light emitting structure. A pad electrode may be provided over (or on) the first electrode. A filling factor may be defined as an area ratio of the first electrode relative to an area of a top surface of the light emitting structure. The filling factor at a first region adjacent to the pad electrode may be different from the filling factor at a second region remote (or away) from the pad electrode.

A light emitting device package may include a light emitting device including a light emitting structure having a first conductive semiconductor layer, an active layer over (or on) the first conductive semiconductor layer and a second conductive semiconductor layer over (or on) the active layer. A first electrode having a pattern (of openings) may be provided over (or on) the light emitting structure, and a pad electrode may be provided over (or on) the first electrode. A package body may be provided in which the light emitting device is installed. At least one electrode layer may be electrically connected to the light emitting device in the package body.

A lighting system may include a light emitting module including a substrate and a light emitting device package over the substrate. The light emitting device package may include a light emitting device including a light emitting structure, a first electrode including a pattern over (or on) the light emitting structure, and a pad electrode over (or on) the first electrode. A package body may be provided in which the light emitting device is installed. At least one electrode layer may be electrically connected to the light emitting device in the package body.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a light emitting structure that includes a first conductive semiconductor layer, an active layer adjacent to the first conductive semiconductor layer, and a second conductive semiconductor layer adjacent to the active layer;
a first electrode adjacent to the light emitting structure, the first electrode having a plurality of openings; and
a pad adjacent to at least a portion of the first electrode,
wherein two adjacent openings in a first area of the first electrode adjacent to the pad have a first opening size, and
wherein two adjacent openings in a second area of the first electrode away from the pad have a second opening size, wherein the first opening size is greater than the second opening size.

2. The light emitting device of claim 1, wherein a radius of the two adjacent openings in the first area is 0.45×a, where a is a distance between centers of the two adjacent openings in the first area.

3. The light emitting device of claim 1, wherein a filling factor is an area ratio of the first electrode relative to an area of a top surface of the light emitting structure, and a first filling factor at the first area adjacent to the pad electrode is different from a second filling factor at the second area away from the pad electrode.

4. The light emitting device of claim 3, wherein the first filling factor is 20% or less.

5. The light emitting device of claim 3, wherein the first filling factor and the second filing factor are not uniform.

6. The light emitting device of claim 5, wherein the first filling factor is less than the second filling factor.

7. The light emitting device of claim 1, wherein the plurality of openings are filled with at least one of air, epoxy or a dielectric substrate.

8. The light emitting device of claim 1, wherein the plurality of openings are uniformly provided on the first electrode.

9. The light emitting device of claim 1, wherein the plurality of openings are non-uniformly provided on the first electrode.

10. The light emitting device of claim 1, wherein the first electrode includes an ohmic layer and a reflective layer on the ohmic layer.

11. The light emitting device of claim 1, wherein the opening is a circular shape.

12. The light emitting device of claim 1, wherein the opening is a polygonal shape.

* * * * *